(12) United States Patent
Liu et al.

(10) Patent No.: US 11,959,948 B2
(45) Date of Patent: Apr. 16, 2024

(54) HIGH VOLTAGE SIGNAL AND LOW VOLTAGE SIGNAL SAMPLING AND TRANSMISSION SYSTEM BASED ON HIGH VOLTAGE MCU

(71) Applicant: JEE AUTOMATION EQUIPMENT (SHANGHAI) CO., LTD., Shanghai (CN)

(72) Inventors: Lei Liu, Shanghai (CN); Minsheng Jiao, Shanghai (CN); Lin Zhang, Shanghai (CN); Yanqi Guo, Shanghai (CN)

(73) Assignee: JEE AUTOMATION EQUIPMENT (SHANGHAI) CO., LTD., Shanghai (CN)

( * ) Notice: Subject to any disclaimer, the term of this patent is extended or adjusted under 35 U.S.C. 154(b) by 158 days.

(21) Appl. No.: 17/697,680

(22) Filed: Mar. 17, 2022

(65) Prior Publication Data

US 2022/0206045 A1    Jun. 30, 2022

Related U.S. Application Data

(63) Continuation of application No. PCT/CN2020/140695, filed on Dec. 29, 2020.

(30) Foreign Application Priority Data

Jul. 24, 2020   (CN) .......................... 202010722671.4

(51) Int. Cl.
   *G01R 19/25*    (2006.01)
   *G01K 7/22*     (2006.01)
   *H02P 23/14*    (2006.01)
   *H02P 29/68*    (2016.01)

(52) U.S. Cl.
   CPC .......... *G01R 19/2503* (2013.01); *G01K 7/22* (2013.01); *H02P 23/14* (2013.01); *H02P 29/68* (2016.02)

(58) Field of Classification Search
   CPC ............ G01R 19/2503; G01R 19/2509; G01R 15/14; G01K 7/22; G01K 7/16; H02P 23/14; H02P 29/68
   USPC ....................................... 324/105, 76.11, 600
   See application file for complete search history.

(56) References Cited

U.S. PATENT DOCUMENTS

| | | | | |
|---|---|---|---|---|
| 2015/0171487 A1* | 6/2015 | Itou | ..................... | H01M 10/482 429/90 |
| 2019/0383670 A1* | 12/2019 | Sathik | ..................... | H02P 29/60 |
| 2022/0214388 A1* | 7/2022 | Liu | ..................... | G01R 31/36 |

FOREIGN PATENT DOCUMENTS

| | | |
|---|---|---|
| CN | 101442211 A | 5/2009 |
| CN | 202384747 U | 8/2012 |

(Continued)

OTHER PUBLICATIONS

First Office Action issued in counterpart Chinese Patent Application No. 202010722671.4, dated Sep. 28, 2022.

(Continued)

*Primary Examiner* — Giovanni Astacio-Oquendo

(74) *Attorney, Agent, or Firm* — Westbridge IP LLC

(57) ABSTRACT

Disclosed is a high voltage signal and low voltage signal sampling and transmission system based on a high voltage MCU, including a sampling unit, a high voltage processing unit, a communication unit and a low voltage processing unit. The sampling unit includes a bus voltage sampling module, a phase voltage detection module and an IGBT temperature detection module. The high voltage processing unit adopts the high voltage MCU, and the high voltage MCU is configured to perform state monitoring and analog-to-digital conversion on the three-way analog detection signals, and output a digital signal to the communication unit; the communication unit adopts an isolated communication unit to transmit the three-way digital signal converted by the high voltage MCU to the low voltage processing unit;

(Continued)

the low voltage processing unit adopts a low voltage MCU to realize sampling and communication of high and low voltage sampling signals.

6 Claims, 1 Drawing Sheet

(56) References Cited

FOREIGN PATENT DOCUMENTS

| CN | 103204081 A | 7/2013 |
|---|---|---|
| CN | 203894319 U | 10/2014 |
| CN | 204422720 U | 6/2015 |
| CN | 204631129 U | 9/2015 |
| CN | 107797076 A | 3/2018 |
| CN | 210155198 U | 3/2020 |
| CN | 111856126 A | 10/2020 |

OTHER PUBLICATIONS

Refusal Decision issued in counterpart Chinese Patent Application No. 202010722671.4, dated May 11, 2023.
Second Office Action issued in counterpart Chinese Patent Application No. 202010722671.4, dated Feb. 11, 2023.
International Search Report and Written Opinion issued in corresponding PCT Application No. PCT/CN2020/140695, dated Apr. 28, 2021.

\* cited by examiner

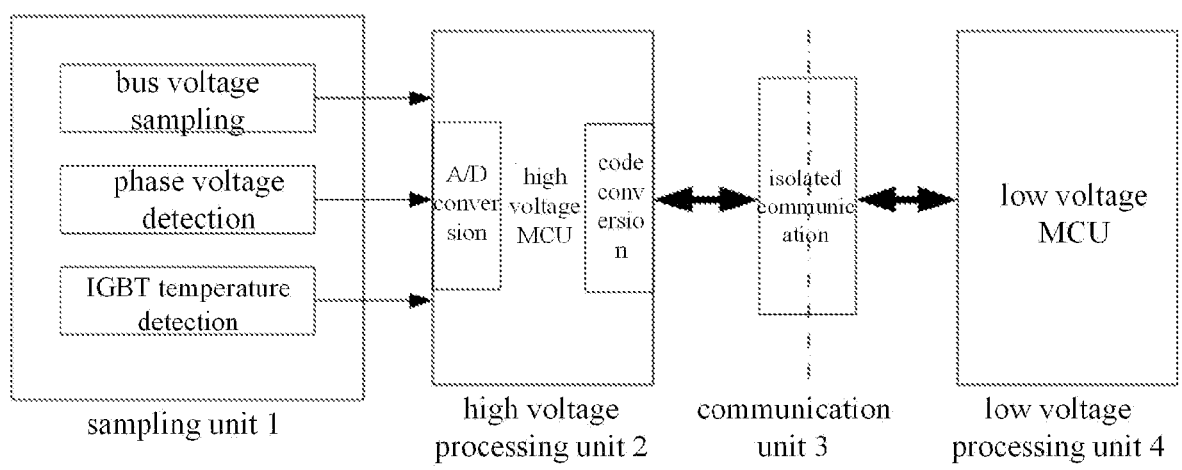

HIGH VOLTAGE SIGNAL AND LOW VOLTAGE SIGNAL SAMPLING AND TRANSMISSION SYSTEM BASED ON HIGH VOLTAGE MCU

CROSS-REFERENCE TO RELATED APPLICATIONS

This application is a continuation application of International Application No. PCT/CN2020/140695, filed on Dec. 29, 2020, which claims priority to Chinese Patent Application No. 202010722671.4, filed on Jul. 24, 2020. The disclosures of the above-mentioned applications are incorporated herein by reference in their entireties.

TECHNICAL FIELD

The present disclosure relates to a new energy vehicle, in particular to a high voltage signal and low voltage signal sampling and transmission system based on a high voltage microcontroller unit (MCU).

BACKGROUND

With the rapid development of modern electric vehicle technology, the output power and safety level of electric vehicles are getting higher, the electrical signals collected internally are becoming more complex. Real-time and high-precision collection of these electrical signals has become a problem that must be solved in the design of automotive electronic hardware. Based on the high voltage and low voltage safety design requirements, the signal on the high voltage side need to be isolated and sampled, which involves an increase in sampling plan design and cost. Based on the high voltage safety requirements of the controller, the bus voltage needs to be monitored in real time and transmitted to the low voltage side. Based on the thermal safety requirements of the controller, the temperature of the insulated gate bipolar transistor (IGBT) operation process needs to be monitored in real time and transmitted to the low voltage side. Based on the calibration requirements of the initial position angle of the motor, the three-phase output phase voltage of the inverter needs to be detected and transmitted to the low voltage side.

The current controller design mostly uses isolation transformers, isolation op amps or isolation optocouplers to complete the high and low voltage sampling signal isolation transmission requirements. According to the system design requirements, an isolation sampling circuit is constructed for the specific signal on the high voltage side, and the analog value of the sampling result is sent to the low voltage MCU detection port to complete the real-time detection of the specific signal. The number of isolation sampling circuits is consistent with the number of signals to be sampled. Each sampling link at the sampling system level is independent of each other. The compatibility and scalability of the system are not high, and the hardware design cost is increased.

SUMMARY

In view of the high cost of sampling design on the high voltage side and the low voltage side in the above-mentioned related art solutions, and consuming a large number of low voltage MCU detection peripheral resources, increasing the complexity of the circuit and other factors, the present disclosure provides a high voltage signal and low voltage signal sampling and transmission system based on a high voltage MCU with low-cost, high-reliability, and high-adaptability.

The high voltage signal and low voltage signal sampling and transmission system based on a high voltage MCU includes a sampling unit, a high voltage processing unit, a communication unit and a low voltage processing unit; wherein:

the sampling unit includes a bus voltage sampling module, a phase voltage detection module and an IGBT temperature detection module, the sampling unit is configured to condition and detect a measured signal on a high voltage side, and generate three-way analog detection signals; the three-way analog detection signals obtained by the sampling unit are transmitted to the high voltage processing unit;

the high voltage processing unit adopts the high voltage MCU, and the high voltage MCU is configured to perform state monitoring and analog-to-digital conversion on the three-way analog detection signals, and output a digital signal to the communication unit;

the communication unit adopts an isolated communication unit to transmit the three-way digital signal converted by the high voltage MCU to the low voltage processing unit;

the low voltage processing unit adopts a low voltage MCU to realize sampling and communication of high and low voltage sampling signals.

Further, the sampling unit is configured to select a specific signal according to system design requirements, and sample and transmit the bus voltage sampling signal, the phase voltage sampling signal and the IGBT temperature sampling signal based on a function and a safety design of a controller.

Further, the bus voltage sampling module includes two sampling circuits, the two sampling circuits are respectively connected to a positive direct current (DC) bus and a negative DC bus, and are configured to design detection circuits with different accuracy levels to meet sampling accuracy requirements of a full voltage range.

Further, the phase voltage detection module is configured to calibrate an initial position angle of a motor, detect a voltage between an output point of an inverter's three-phase voltage and the negative DC bus, and carry out electro-static discharge (ESD) design for a sampling circuit port.

Further, the IGBT temperature detection module is configured to monitor a state of temperature-sensing negative temperature coefficient (NTC) resistor of a power module, convert a resistance value change into a voltage change range, and monitor an IGBT temperature online in real time.

Further, the sampling unit is further configured to increase a number of sampling channels according to requirement for sampling quantity of the signals on the high voltage side.

In the embodiment of the present disclosure, the high voltage MCU unit has its own analog-to-digital conversion function to sample and manage the signal on the high voltage side, which greatly simplifies the design of the multi-channel sampling signal on the high voltage side, improves the stability of the circuit, and enhances the ductility of the sampling system.

In the embodiment of the present disclosure, through the internal data decoding function of the high voltage MCU, the multi-channel sampling values are encoded and the signals on the high voltage side are uniformly isolated and transmitted through a single isolation chip, which saves a lot of high voltage and low voltage sampling isolation devices and greatly reduces the device cost.

In the embodiment of the present disclosure, the low voltage MCU detection end can receive and monitor all the sampling signals on the high voltage side only through the communication port, saving a lot of peripheral detection resources, simplifying the circuit design of the sampling port, and enhancing the compatibility and stability of the sampling system.

BRIEF DESCRIPTION OF THE DRAWINGS

The accompanying drawings forming a part of the present disclosure are used to provide further understanding of the present disclosure, and the exemplary embodiments of the present disclosure and their descriptions are used to explain the present disclosure and do not constitute an improper limitation of the present disclosure.

FIG. 1 is a schematic diagram of a high voltage signal and low voltage signal sampling and transmission system based on a high voltage MCU.

DETAILED DESCRIPTION OF THE EMBODIMENTS

As shown in FIG. 1, the present disclosure provides a high voltage signal and low voltage signal sampling and transmission system based on a high voltage MCU, including a sampling unit 1, a high voltage processing unit 2, a communication unit 3 and a low voltage processing unit 4. The sampling unit 1 includes a bus voltage sampling module, a phase voltage detection module and an IGBT temperature detection module. The sampling unit 1 is configured to condition and detect a measured signal on a high voltage side, and generate three-way analog detection signals. The three-way analog detection signals obtained by the sampling unit 1 are transmitted to the high voltage processing unit 2. The high voltage processing unit 2 adopts the high voltage MCU, and the high voltage MCU is configured to perform state monitoring and analog-to-digital conversion on the three-way analog detection signals, and output a digital signal to the communication unit 3. The communication unit 3 adopts an isolated communication unit to transmit the three-way digital signal converted by the high voltage MCU to the low voltage processing unit 4. The low voltage processing unit 4 adopts a low voltage MCU to realize sampling and communication of high and low voltage sampling signals.

Specifically, the sampling unit 1 includes an integrated bus voltage sampling module, a phase voltage detection module and an IGBT temperature detection module. The sampling unit 1 is used to simultaneously sample the bus voltage signal, the phase voltage detection signal and the IGBT temperature signal, and transmit the obtained three-way analog signals to the high voltage processing module.

The high voltage processing unit 2 includes an integrated AD conversion module and a code conversion module. The high voltage processing unit 2 is used to perform analog-to-digital conversion and code conversion on the received three-way analog detection signals to obtain three-way digital signals. The encoded three-way digital signals are transmitted to the low voltage processing unit 4 using a single isolated communication unit. Optionally, the sampling unit 1 completes signal conditioning on the signals that need to be sampled on the high voltage side, and uniformly transmits them to the high voltage MCU for processing. The sampling unit 1 is configured to select a specific signal according to system design requirements, and sample and transmit the bus voltage sampling signal, the phase voltage sampling signal and the IGBT temperature sampling signal based on a function and a safety design of a controller.

In an embodiment, the bus voltage sampling module includes two sampling circuits, the two sampling circuits are respectively connected to a positive DC bus and a negative DC bus, and are configured to design detection circuits with different accuracy levels to meet sampling accuracy requirements of a full voltage range.

In an embodiment, the phase voltage detection module is configured to calibrate an initial position angle of a motor, detect a voltage between an output point of an inverter's three-phase voltage and the negative DC bus, and carry out ESD design for a sampling circuit port.

In an embodiment, the IGBT temperature detection module is configured to monitor a state of temperature-sensing NTC resistor of a power module, convert a resistance value change into a voltage change range, and monitor an IGBT temperature online in real time.

By adopting the sampling scheme of the high voltage MCU, the solution of this embodiment can directly perform high voltage side sampling and analog-to-digital processing on the high voltage side signal, thereby reducing hardware design and device cost. The signal status can be monitored in real time through the high voltage side, and the high voltage side fault can be quickly protected and processed to improve the safety level of the system.

Compared with the traditional method of building an independent sampling link, the complexity of the sampling system is directly related to the number of sampling channels, the improved sampling scheme has great adaptability for high voltage side signal sampling. With the increase in the number of high voltage side signal sampling in the later stage, sampling channels can be flexibly added, which enhances the compatibility and scalability of the sampling system.

The above-mentioned embodiments are only intended to illustrate the technical concept and characteristics of the present disclosure, and the purpose thereof is to enable those skilled in the art to understand the content of the present disclosure and implement them accordingly, and cannot limit the protection scope of the present disclosure. All modifications made according to the spirit and essence of the main technical solutions of the present disclosure should be covered within the protection scope of the present disclosure.

What is claimed is:

1. A high voltage signal and low voltage signal sampling and transmission system based on a high voltage microcontroller unit (MCU), comprising a sampling unit, a high voltage processing unit, a communication unit and a low voltage processing unit; wherein:

the sampling unit comprises a bus voltage sampling module, a phase voltage detection module and an insulated gate bipolar transistor (IGBT) temperature detection module, the sampling unit is configured to condition and detect a measured signal on a high voltage side, and generate three-way analog detection signals; the three-way analog detection signals obtained by the sampling unit are transmitted to the high voltage processing unit;

the high voltage processing unit adopts the high voltage MCU, and the high voltage MCU is configured to perform state monitoring and analog-to-digital conversion on the three-way analog detection signals, and output a digital signal to the communication unit;

the communication unit adopts an isolated communication unit to transmit the three-way digital signal converted by the high voltage MCU to the low voltage processing unit; and the low voltage processing unit adopts a low voltage MCU to realize sampling and communication of high and low voltage sampling signals.

2. The high voltage signal and low voltage signal sampling and transmission system based on the high voltage MCU of claim 1, wherein the sampling unit is configured to select a specific signal according to system design requirements, and sample and transmit the bus voltage sampling signal, the phase voltage sampling signal and the IGBT temperature sampling signal based on a function and a safety design of a controller.

3. The high voltage signal and low voltage signal sampling and transmission system based on the high voltage MCU of claim 2, wherein the bus voltage sampling module comprises two sampling circuits, the two sampling circuits are respectively connected to a positive direct current (DC) bus and a negative DC bus, and are configured to design detection circuits with different accuracy levels to meet sampling accuracy requirements of a full voltage range.

4. The high voltage signal and low voltage signal sampling and transmission system based on the high voltage MCU of claim 2, wherein the phase voltage detection module is configured to calibrate an initial position angle of a motor, detect a voltage between an output point of an inverter's three-phase voltage and the negative DC bus, and carry out electro-static discharge (ESD) design for a sampling circuit port.

5. The high voltage signal and low voltage signal sampling and transmission system based on the high voltage MCU of claim 2, wherein the IGBT temperature detection module is configured to monitor a state of temperature-sensing negative temperature coefficient (NTC) resistor of a power module, convert a resistance value change into a voltage change range, and monitor an IGBT temperature online in real time.

6. The high voltage signal and low voltage signal sampling and transmission system based on the high voltage MCU of claim 1, wherein the sampling unit is further configured to increase a number of sampling channels according to requirement for sampling quantity of the signals on the high voltage side.

* * * * *